(12) United States Patent
Park et al.

(10) Patent No.: US 6,511,888 B1
(45) Date of Patent: Jan. 28, 2003

(54) METHOD OF FABRICATING A SEMICONDUCTOR DEVICE USING TRENCH ISOLATION METHOD INCLUDING HYDROGEN ANNEALING STEP

(75) Inventors: Tai-su Park, Suwon (KR); Kyung-won Park, Suwon (KR); Jung-woo Park, Seoul (KR); Won-sang Song, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/697,302

(22) Filed: Oct. 27, 2000

(30) Foreign Application Priority Data

Nov. 12, 1999 (KR) .............................. 99-50223

(51) Int. Cl.[7] ........................ H01L 21/336; H01L 21/76
(52) U.S. Cl. ........................................ 438/296; 438/424
(58) Field of Search .................................. 438/296, 424

(56) References Cited

U.S. PATENT DOCUMENTS 5,258,332 A * 11/1993 Horioka et al.
6,037,238 A * 3/2000 Chang et al.
6,069,091 A * 5/2000 Chang et al.
6,084,276 A * 7/2000 Gambino et al.
6,249,026 B1 * 6/2001 Matsumoto et al.

FOREIGN PATENT DOCUMENTS

KR     1999-006961    1/1999

* cited by examiner

Primary Examiner—Richard Booth
Assistant Examiner—Ron Pompey
(74) Attorney, Agent, or Firm—Lee & Sterba, P.C.

(57) ABSTRACT

A method of fabricating a semiconductor device using a trench isolation method including a hydrogen annealing step, wherein a photoresist pattern is formed on a semiconductor substrate, a pad insulating layer may be formed before forming the photoresist pattern, the semiconductor substrate is etched using the photoresist pattern as an etching mask to form a trench, and an isolation layer is formed in the trench. To remove damages created in an active region defined by the isolation layer, the semiconductor substrate having the isolation layer is annealed in a hydrogen atmosphere.

6 Claims, 5 Drawing Sheets

METHOD OF FABRICATING A SEMICONDUCTOR DEVICE USING TRENCH ISOLATION METHOD INCLUDING HYDROGEN ANNEALING STEP

BACKGROUND OF THE INVENTION

1. Field of the Invention

The present invention relates to a method of fabricating a semiconductor device, using a trench isolation method.

2. Description of the Related Art

Local oxidation of silicon (LOCOS), which is widely used in fabricating semiconductor devices, has an advantage of simplifying the fabrication. For extremely integrated semiconductor devices such as 256M dynamic random access memory (DRAM) devices, a width for device isolation is reduced to be smaller than a predetermined limit so that a problem can occur during a selective oxidation process in the LOCOS. In other words, a punch-through phenomenon occurs, or the thickness of a field oxide film is so reduced that adjacent semiconductor devices cannot be electrically isolated. Recently, a trench isolation method has been proposed for solving the above problems of the LOCOS.

According to one trench isolation method, a pad oxide layer and a pad nitride layer are sequentially deposited on a semiconductor substrate to form a mask pattern. The semiconductor substrate is etched using the mask pattern as an etching mask to form a trench. Subsequently, a thermal oxide film is formed on the inside wall of the trench. Next, a gap filling dielectric layer is deposited on the entire surface of the semiconductor substrate by a chemical vapor deposition method to fill the trench. Next, the gap filling dielectric layer is planarized by a chemical-mechanical polishing method to be substantially level with the pad nitride layer of the mask pattern. Thereafter, the mask pattern is removed, thereby forming a trench isolation layer.

The above trench isolation method solves the problems of the LOCOS method, but the processes are more complicated than those of the LOCOS method, thereby increasing the manufacturing cost. Moreover, since the thick mask pattern has been formed on both sides of the trench when the gap filling dielectric layer is formed to fill the trench, a problem that the substantial aspect ratio of the trench increases occurs due to the thick mask pattern. Consequently, voids may be caused within an isolation layer during the formation of the gap filling dielectric layer.

To prevent an increase in substantial aspect ratio of the trench due to the thick mask pattern, the thickness of the pad nitride layer may be reduced. If the thickness of the pad nitride layer is reduced, however, a problem occurs when the gap filling dielectric layer is planarized by a chemical-mechanical polishing method. In other words, when the pad nitride layer is thin, physical damage such as scratches may occur on the top of the semiconductor substrate due to abrasives contained in slurry used in a chemical-mechanical polishing method. If physical damages such as scratches occurs on the top of the semiconductor substrate, a gate oxide can be deteriorated, thereby decreasing the reliability of a semiconductor device.

SUMMARY OF THE INVENTION

To address the above problems, it is a feature of the present invention to provide a trench isolation method for simplifying fabrication, facilitating filling of a trench, and improving the reliability of a gate insulating layer.

This and other features of the present invention may be achieved by a trench isolation method comprising forming a trench in a semiconductor substrate, forming an isolation layer in the trench, and annealing the semiconductor substrate having the isolation layer in a hydrogen atmosphere.

BRIEF DESCRIPTION OF THE DRAWINGS

The accompanying drawings, which are incorporated in and which constitute a part of this specification, illustrate embodiments of the invention. Throughout the drawings, corresponding parts are labeled with corresponding reference numbers.

DETAILED DESCRIPTION OF THE PREFERRED EMBODIMENTS

Figure 1A:
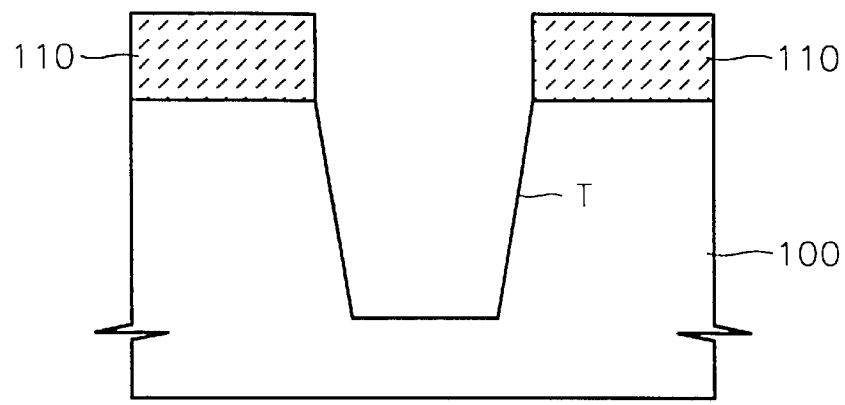
FIGS. 1A through 1E are sectional views for showing a simplified trench isolation method including a hydrogen annealing step according to a first preferred embodiment of the present invention.

Korean Patent Application No. 99-50223, filed Nov. 12, 1999, and entitled: "Trench Isolation Method Including Hydrogen Annealing Step" is incorporated by reference herein in its entirety.

In the drawings, the thickness of films or regions are exaggerated for clarity. When a film is described as being on another film or a semiconductor substrate, it can be directly on the other film or the semiconductor substrate or an interlayer film can exist therebetween. Further, it is possible that various steps can be added to the steps described in the embodiments below to improve the characteristics of devices.

FIRST EMBODIMENT

Referring to FIG. 1A, a photoresist pattern 110 used as an etching mask is formed on a semiconductor substrate 100 by a typical method, for example, photolithography. The photoresist pattern 110 exposes part of the semiconductor substrate 100, i.e., a portion in which an isolation region will be formed.

Next, the semiconductor substrate 100 is etched using the photoresist pattern 110 as an etching mask to form a trench T in the semiconductor substrate 100. It is preferable to use a dry etch method having a good anisotropic etching characteristic when forming the trench T. For example, dry etch using chloride ($Cl_2$) and hydrogen bromide (HBr) as etching gases may be used. The trench T is formed deep enough to electrically isolate semiconductor devices, e.g., transistors formed in active regions. For example, the trench T has a depth of 0.25 $\mu$m.

Figure 1B:
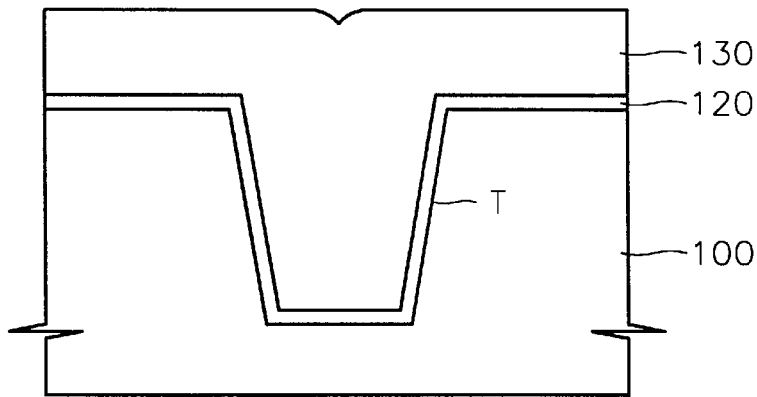

Referring to FIG. 1B, the photoresist pattern 110 is removed from the semiconductor substrate 100 by a typical method, by using an oxygen plasma, for example. Next, a thermal oxide film 120 is formed on the top of the semiconductor substrate 100 and the inner wall of the trench T. The thickness of the thermal oxide film 120 may be 30–500 Å.

The thermal oxide film 120 removes defects in the inner wall of the trench T that occurred when the trench T is formed by dry etch. The thermal oxide film 120 allows for the surface of the semiconductor substrate 100 exposed through the inner wall of the trench to be in a stable state (bonding of Si and $O_2$), thereby preventing leakage current bonding on the surface of the trench T. The thermal oxide film 120 rounds the corners at the bottom of the trench T, thereby alleviating concentration of mechanical stress at the bottom corners of the trench T.

The thermal oxide film 120 on the surface of the semiconductor substrate 100 functions as a pad oxide layer.

After forming the thermal oxide film 120, a gap filling dielectric layer 130 is formed on the entire surface of the semiconductor substrate 100 to fill the trench T. A thick mask pattern used in a conventional technology does not exist at the right and left sides of the trench T to be filled with the gap filling dielectric layer 130. Accordingly, it does not happen that the aspect ratio of the trench T is increased due to a thick mask pattern so that occurrence of voids within the trench T can be alleviated.

The gap filling dielectric layer 130 may be formed by a method such as a chemical vapor deposition (CVD), subatmospheric chemical vapor deposition (SACVD), low pressure chemical vapor deposition (LPCVD), plasma enhanced chemical vapor deposition (PECVD), or high density plasma chemical vapor deposition (HDP CVD). The gap filling dielectric layer 130 may be a silicon oxide, silicon oxy nitride, phosphosilicate glass (PSG), borophosphosilicate glass (BPSG), tetraethylorthosilicate (TEOS), plasma enhanced tetraethylorthosilicate (PE-TEOS), ozone-TEOS, undoped silicate glass (USG) based on ozone-TEOS, silicon oxide formed by an HDP CVD method, or USG formed at high temperature.

After forming the gap filling dielectric layer 130, heat treatment may be selectively performed to enhance the density of the gap filling dielectric layer 130.

Heat treatment may be performed at a temperature of 700–1200° C. in an atmosphere of a wet-oxidation, a dry-oxidation, or inert gases such as nitrogen ($N_2$) and argon (Ar) for a time of several minutes through several hours.

Figure 1C:
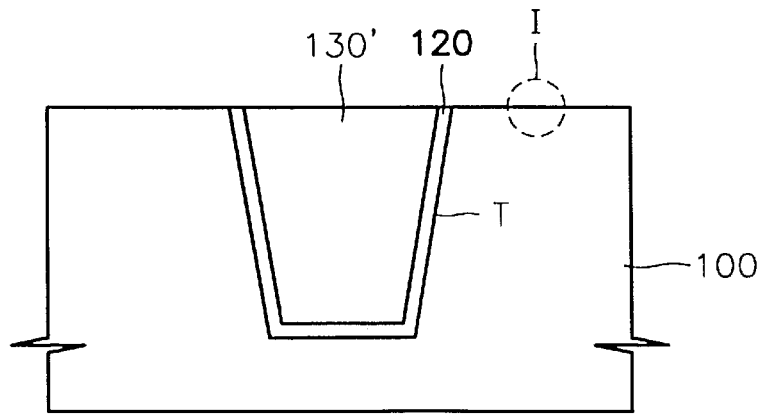

Referring to FIG. 1C, the entire surface of the semiconductor substrate 100 having the gap filling dielectric layer 130 is planarized to expose the top surface of the semiconductor substrate 100. The planarization may be performed by a chemical mechanical polishing (CMP) method or an etchback method. When the planarization is completed, an isolation layer 130' is created within the semiconductor substrate 100 to define an active region.

During the planarization, the semiconductor substrate 100 is preferably used as a planarization stopper. Accordingly, when planarizing the entire surface of the semiconductor substrate 100 using a CMP method, it is preferable to use slurry containing abrasives of the ceria family. When using slurry containing abrasives of the ceria family, it is preferable to use slurry containing surfactant having a strong anion property in addition to the abrasives of the ceria family. It is preferable to control the pH of the slurry such that the gap filling dielectric layer 130 and the thermal oxide film 120 have a negative zeta potential and the semiconductor substrate 100 has a positive zeta potential. If the pH of the slurry is controlled as described above, since the anion surfactant adheres to the top surface of the semiconductor substrate 100 when the top surface of the semiconductor substrate 100 is exposed during the planarization, polishing of the semiconductor substrate 100 by the abrasives of the ceria family is restrained. In other words, the anion surfactant does not adhere to the surfaces of the gap filling dielectric layer 130 and the thermal oxide film 120, which have a negative zeta potential. Consequently, the gap filling dielectric layer 130 and the thermal oxide film 120 are selectively removed by the abrasives of the ceria family.

In a test performed by the inventor, it was confirmed that the CMP etching selection ratio of the semiconductor substrate 100 to the gap filling dielectric layer 130 and the CMP etching selection ratio of the semiconductor substrate 100 to the thermal oxide film 120 were about 1:17, when the pH of slurry was maintained at about 7. Accordingly, it was seen that the semiconductor substrate 100 itself can be used as a CMP stopper when slurry of the ceria family is used, so that the amount of CMP can be constantly maintained to obtain an isolation layer 130' having a uniform thickness. It was also confirmed in the test that since the CMP etching selection ratio of the semiconductor substrate 100 to the gap filling dielectric layer 130 is small when CMP slurry of the silica family is used, it is difficult to use the semiconductor substrate 100 as a CMP stopper. In other words, if slurry of the silica family is used when the gap filling dielectric layer 130 is planarized by a CMP method, the amount of CMP is not constantly maintained. Consequently, the depth of the finally formed isolation layer 130' is nonuniform across the substrate 100. This nonuniform amount of CMP causes variations in the size of the active region defined by the isolation layer 130' when the side wall of the trench T is formed to be slanted. In other words, when the trench T is formed to taper downward, the size of an isolation region is decreased and the size of an active region is increased in a case in which the amount of CMP is large. This causes the width of a transistor formed in the active region to be nonuniform. Accordingly, variations in the threshold voltage of a transistor may occur. These problems can be solved when the planarization is performed by a CMP method using slurry of the ceria family as described above in the first embodiment of the present invention.

It is known that the rate of CMP is rapidly decreased when the pH of a preferable predetermined value is changed in a case in which slurry of the silica family is used. However, according to the test performed by the inventor, slurry of the ceria family is less sensitive to variations in a pH value than the slurry of the silica family, so that it was seen that the amount of CMP is not changed very much even if a pH value is changed.

According to the first embodiment of the present invention, the photoresist pattern 110 is used as an etching mask when forming the trench T, thereby simplifying fabrication as compared with a conventional trench isolation method. Moreover, since the semiconductor substrate 100 is used as a CMP stopper, an additional etch stop layer is not needed. Further, by using slurry of the ceria family, the etching selection ratio of the semiconductor substrate 100 to the gap filling dielectric layer 130 and the etching selection ratio of the semiconductor substrate 100 to the thermal oxide film 120 are large, so that the amount of CMP can be uniform on the entire surface of the semiconductor substrate 100. Consequently, the isolation layer 130' having a relatively uniform thickness across the substrate 100 can be obtained.

While the trench isolation method according to the first embodiment of the present invention has an advantage of simplifying the fabrication, the active region defined by the isolation layer 130' can be damaged during the planarization by a CMP method because the semiconductor substrate 100 is used as a CMP stopper during the planarization. For example, when the planarization is performed by a CMP method, physical damage such as scratches or infinitesimal damage of a nano scale may be caused in the active region by the abrasives contained in slurry. This will be described in detail with reference to FIG. 1D, which is an enlarged view of the portion I of FIG. 1C.

Figure 1D:
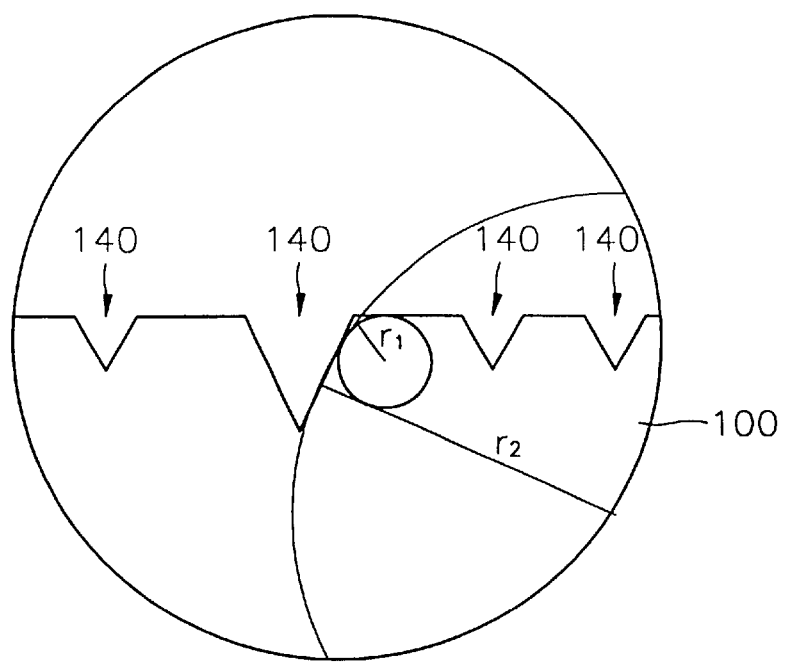

FIG. 1D shows damage observed in the active region defined by the isolation layer 130' in step of planarizing the gap filling dielectric layer 130 using a CMP method. Scratches 140, caused by the abrasives contained in slurry used during the planarization by a CMP method, may be found in the active region. Although not shown, infinitesimal damages of a nano scale, which are not found as the scratches 140, may be caused. When a gate oxide layer is formed on the active region without removing the damage in the active region, the reliability of the gate oxide layer is decreased. This is because an electrical field is concentrated at the bottom of each scratch 140 when voltage is applied to a gate electrode to drive a transistor formed in the active region, and thus the insulation characteristic of the gate oxide layer is degraded. Accordingly, the preferred embodiments of the present invention additionally perform a step of removing damage occurring in an active region after forming the isolation layer 130'.

Figure 1E:
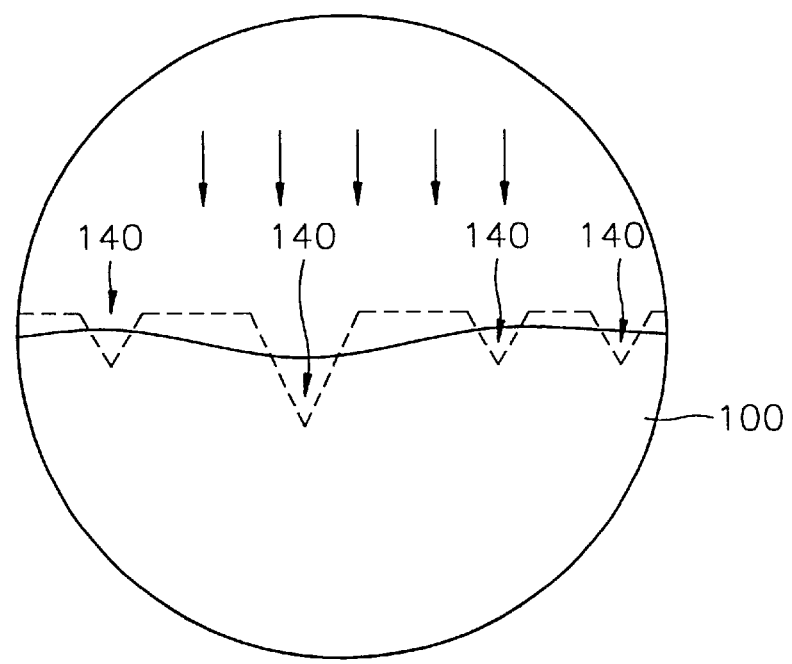

Referring to FIG. 1E, which is an enlarged view of the portion I of FIG. 1C, the semiconductor substrate 100, in which the isolation layer 130' is formed, is loaded onto a heat treatment apparatus to perform an annealing step in a hydrogen atmosphere so as to remove the damage in the active region. The hydrogen annealing step is conceptionally represented by arrows in FIG. 1E. A furnace type heat treatment apparatus or a rapid heat treatment apparatus may be used for performing the annealing step.

When the hydrogen annealing step is performed at high temperature, mass transfer happens on the top surface of the semiconductor substrate 100. For example, in a case in which the semiconductor substrate 100 is silicon, silicon atoms in an active region move to reduce a surface topology when the hydrogen annealing step is performed at high temperature. In other words, silicon atoms on a surface having a small radius of curvature r, move to a surface having a large radius of curvature $r_2$ to reduce surface energy. As a result, the profile of the top surface of the active region changes from that shown by a doted line into that shown by a solid line, and thus the scratches 140 occurring in the active region are reduced, or removed. It is apparent that infinitesimal damage of a nano scale is also reduced, or removed during the above step.

The speed of mass transfer in an active region of the semiconductor substrate 100 varies depending on the pressure of hydrogen gas and the temperature at which the annealing step is performed. For example, when the temperature, at which the annealing step is performed, is increased, while the pressure of hydrogen gas creating a hydrogen atmosphere is maintained, the speed of mass transfer in an active region increases. When the pressure of hydrogen gas creating a hydrogen atmosphere is increased, while the temperature for performing the annealing step is maintained, the speed of mass transfer in an active region increases.

In the hydrogen annealing step performed to remove damage in an active region, the temperature is preferably 500–950° C. to make the mass in an active region smoothly move along the surface. For a heat treatment apparatus in which the annealing step is performed, the pressure of hydrogen gas in a chamber thereof is preferably $10^{-4}$–$10^3$ torr. The annealing step is preferably performed for 10 seconds through 1 hour. The annealing step may be performed at a temperature of 950° C. and at a hydrogen pressure of 380 torr for 60 seconds. The annealing step may be performed at a temperature of 1100° C. and at a hydrogen pressure of 80 torr for 60 seconds. The annealing step may be performed at a temperature of 800° C. and at a hydrogen pressure of 1 mtorr for 5 seconds.

By reducing or removing damage in an active region using the hydrogen annealing step, the reliability of a gate oxide layer formed in the active region in a succeeding step is improved.

SECOND EMBODIMENT

In the second embodiment of the present invention, a thin nitride liner 125 is formed on the thermal oxide film 120 before forming the gap filling dielectric layer 130 for filling the trench T. The nitride liner 125 is used as a planarization stop layer during planarization of the gap filling dielectric layer 130.

Figure 2A:
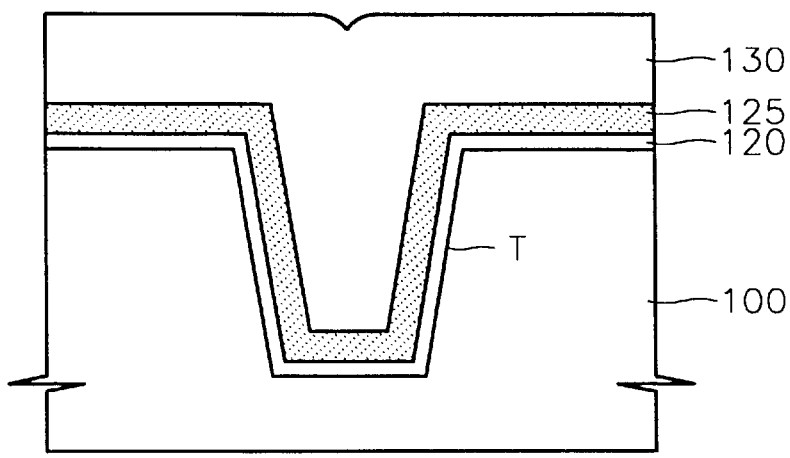
FIGS. 2A through 2C are sectional views for showing a simplified trench isolation method including a hydrogen annealing step according to a second preferred embodiment of the present invention.

Referring to FIG. 2A, in the same manner as in the first embodiment, a photoresist pattern (not shown) is formed, a trench T is formed in a semiconductor substrate 100 using the photoresist pattern as an etching mask, the photoresist pattern is removed, and, subsequently, a thermal oxide film 120 is formed on the entire surface of the semiconductor substrate 100.

Next, a thin nitride liner 125 is formed along the surface topology of the thermal oxide film 120. The nitride liner 125 may be formed by methods such as CVD, SACVD, LPCVD or PECVD. The nitride liner 125 prevents oxidation of the side wall of the trench T during a succeeding step of filling the trench T with the gap filling dielectric layer 130. The nitride liner 125 is also used as a planarization stop layer during planarization of the gap filling dielectric layer 130.

Since the nitride liner 125 has a different coefficient of thermal expansion than the gap filling dielectric layer 130 formed later to fill the trench T, mechanical stress exceeding a limit value may occur in the semiconductor substrate 100 when the nitride liner 125 is thickly formed. In addition, when the nitride liner 125 acting as a planarization stop layer is removed from the semiconductor substrate 100 by a wet etch method, an etching time may be increased. Accordingly, the nitride liner 125 is formed to a thickness of 40–500 Å, preferably, to a thickness of 100 Å.

After forming the nitride liner 125, the gap filling dielectric layer 130 is formed on the entire surface of the semiconductor substrate 100 to fill the trench T. A method of forming the gap filling dielectric layer 130 and a material layer for the gap filling dielectric layer 130 are the same as those used in the first embodiment. After forming the gap filling dielectric layer 130, similarly to the first embodiment, heat treatment may be selectively performed to enhance the insulation characteristic of the gap filling dielectric layer 130. In the same manner as in the first embodiment, in the second embodiment, occurrence of voids in the trench T may be alleviated when the trench T is filled with the gap filling dielectric layer 130, because the aspect ratio of the trench T is not substantially increased due to the nitride liner 125 formed on the semiconductor substrate 100.

Figure 2B:
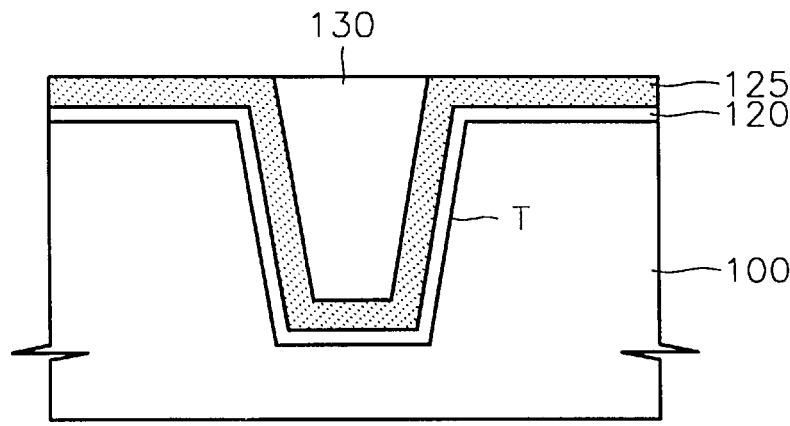

Referring to FIG. 2B, the entire surface of the semiconductor substrate 100 having the gap filling dielectric layer 130 is planarized using the nitride liner 125 as a planarization stop layer. The planarization may be performed by a CMP method or an etchback method. Similarly to the first embodiment, when the planarization is performed by a CMP method, slurry containing abrasives of the ceria family and an anion surfactant is preferably used. It is preferable to set the pH of the slurry at the same value as in the first embodiment, i.e., at about 7. Then, the zeta potential of the gap filling dielectric layer 130 has a negative value, and the zeta potential of the nitride liner 125 has a positive value. Accordingly, when the nitride liner 125 is exposed during the planarization, the anion surfactant adheres to the surface of the nitride liner 125 so that the polishing of the nitride liner 125 by the abrasives of the ceria family can be restrained. On the other hand, since the surfactant does not adhere to the surface of the gap filling dielectric layer 130, the abrasives of the ceria family react with the gap filling dielectric layer 130, thereby removing the gap filling dielectric layer 130. According to a test performed by the inventor, when the pH of slurry was maintained at about 7, the CMP etching selection ratio of the nitride liner 125 to the gap filling dielectric layer 130 was about 1:48. This is triple the CMP etching selection ratio of 1:17 of the first embodiment. As a result, when the nitride liner 125 is used as a CMP stopper, the amount of etching by CMP can be more stably maintained as compared with the first embodiment using the semiconductor substrate 100 as a CMP stopper.

Figure 2C:
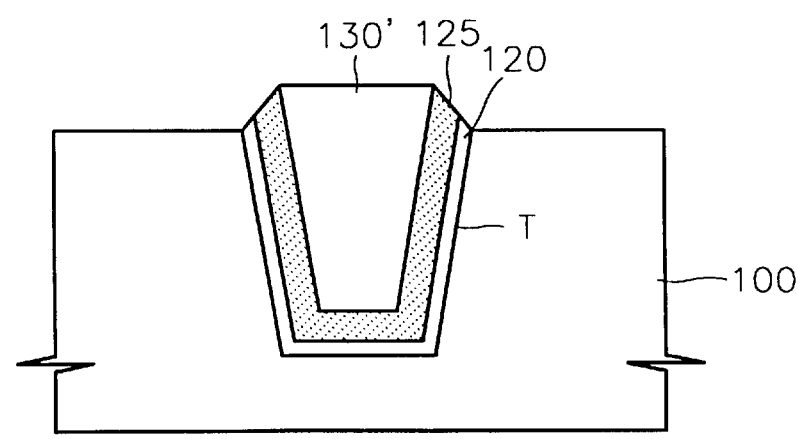

Referring to FIG. 2C, the nitride liner 125 is exposed by planarizing the gap filling dielectric layer 130, and then the nitride liner 125 used as a planarization stop layer is removed. The nitride liner 125 may be removed by a wet etch method, for example, a wet etch method using phosphoric acid, or a dry etch method using plasma. Next, the thermal oxide film 120, exposed after the removal of the nitride liner 125, is removed by a wet etch method, for example, a method using a HF solution or a buffered oxide etchant (BOE) solution. As a result, an isolation layer 130' defining an active region is completed.

Damage, for example, scratches (see 140 in FIG. 1D) may occur on the surface of the semiconductor substrate 100 during the planarization of the gap filling dielectric layer 130 using a CMP method as in the first embodiment. This is because the nitride liner 125 is thin even if the nitride liner 125 is used as a CMP stopper. Problems occurring when the semiconductor substrate 100 is damaged were described in the first embodiment. Accordingly, it is preferable to additionally perform a step for compensating for the damage on the semiconductor substrate 100 in the same manner as in the first embodiment. While the semiconductor substrate 100 is used as a CMP stopper in the first embodiment, the nitride liner 125 which is a material layer additionally formed on the semiconductor substrate 100 is used as a CMP stopper in the second embodiment, and therefore, the semiconductor substrate 100 will be less damaged than in the first embodiment.

A hydrogen annealing step is performed to compensate for the damage in an active region during the planarization by a CMP method. The hydrogen annealing step is indicated by arrows in FIG. 2C. The hydrogen annealing step is preferably performed under the same conditions as in the first embodiment. The mechanism of removing damage in an active region by the hydrogen annealing step has been described with reference to FIG. 1E. By removing the damage in an active region by the hydrogen annealing step, the reliability of a gate oxide layer formed in the active region in a succeeding step can be improved.

THIRD EMBODIMENT

Unlike the second embodiment, a pad insulating layer 105 is formed on a semiconductor substrate before forming a photoresist pattern 110 in a third embodiment.

Figure 3A:
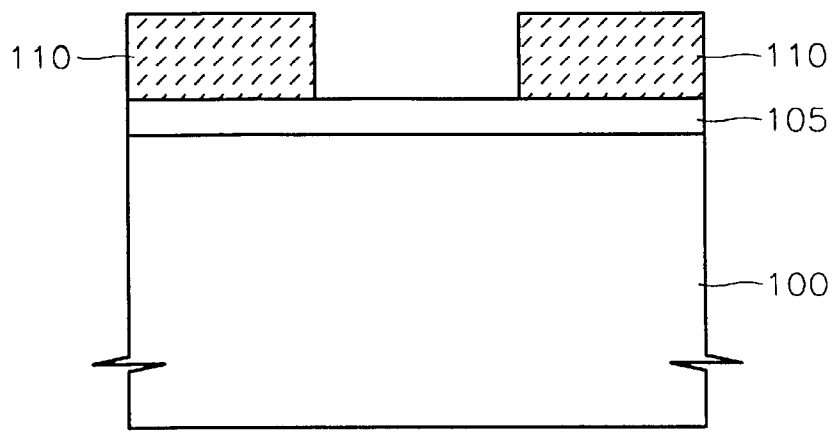
FIGS. 3A through 3C are sectional views for showing a simplified trench isolation method including a hydrogen annealing step according to a third preferred embodiment of the present invention.

Referring to FIG. 3A, a pad insulating layer 105 is formed on a semiconductor substrate 100. The pad insulating layer 105 may be a silicon oxide layer or a silicon oxy nitride layer. When the pad insulating layer 105 is formed of silicon oxide layer, thermal oxidation may be used. When the pad insulating layer 105 is formed of a silicon oxy nitride layer, a CVD method, an LPCVD method, an SACVD method or a PECVD method may be used. The pad insulating layer 105 is preferably formed to a thickness that does not increase the aspect ratio of a trench T substantially when the trench T is filled with a gap filling dielectric layer later 130. The pad insulating layer 105 may be formed to a thickness of 100–1500 Å, and preferably, to a thickness of 500 Å. After forming the pad insulating layer 105, a photoresist pattern 110 is formed on the pad insulating layer 105.

Figure 3B:
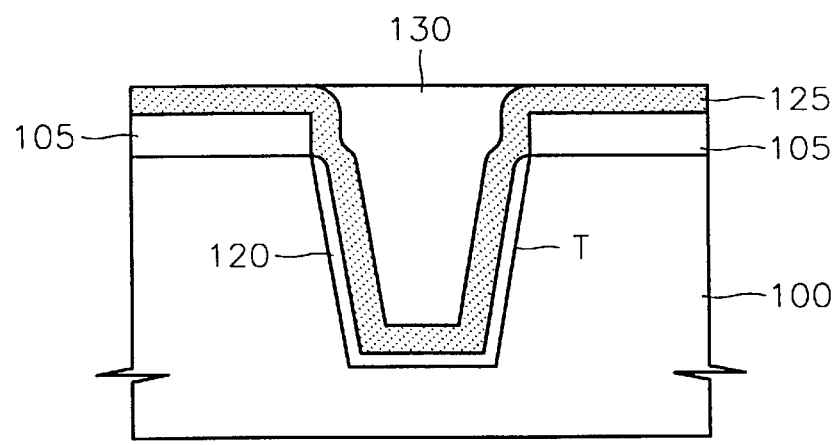

Referring to FIG. 3B, the pad insulating layer 105 is patterned and simultaneously, the semiconductor substrate 100 is etched, using the photoresist pattern 110 as an etching mask, thereby forming the trench T within the semiconductor substrate 100. Then, the photoresist pattern 110 is removed. Alternately, the semiconductor substrate 100 is exposed by patterning the pad insulating layer 105 using the photoresist pattern 110 as an etching mask. After removing the photoresist pattern 110, the semiconductor substrate 100 is etched using the patterned pad insulating layer 105 as an etching mask, thereby forming the trench T within the semiconductor substrate 100.

After forming the trench T, a thermal oxide film 120 is formed on the inner wall of the trench T. A method for forming the thermal oxide film 120 and the thickness and the function of the thermal oxide film 120 have been described in the first embodiment. Next, a nitride liner 125 is formed on the entire surface of the semiconductor substrate 100 having the thermal oxide film 120. A method for forming the nitride liner 125 and the thickness and the function of the nitride liner 125 have been described in detail with reference to FIG. 2A in the second embodiment. After forming the nitride liner 125, a gap filling dielectric layer 130 for filling the trench T is formed on the entire surface of the semiconductor substrate 100. Next, the entire surface of the semiconductor substrate 100 having the gap filling dielectric layer 130 is planarized using the nitride liner 125 as a planarization stop layer. The step of planarizing the gap filling dielectric layer 130 using the nitride liner 125 as a planarization stop layer has been described in detail with reference to FIG. 2B in the second embodiment.

Heat treatment may be selectively performed before planarizing the gap filling dielectric layer 130 to enhance the insulation characteristic of the gap filling dielectric layer 130. The heat treatment has been described in detail with reference to FIG. 1B in the first embodiment.

Figure 3C:
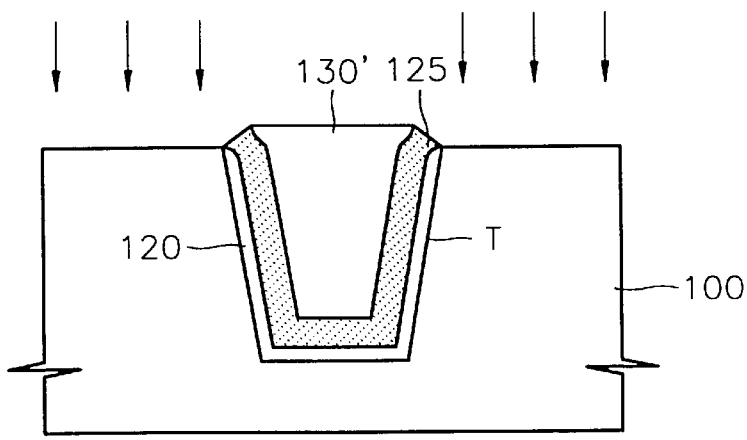

Referring to FIG. 3C, the pad insulating layer 105 and the nitride liner 125 are removed from the semiconductor substrate 100 to form an isolation layer 130'. The pad insulating layer 105 may be removed using a HF solution or a BOE solution, and the nitride liner 125 may be removed using a phosphoric acid solution.

As in the second embodiment, damage created during the planarization of the gap filling dielectric layer 130 may exist in an active region defined by the isolation layer 130'. Accordingly, a hydrogen annealing step is performed to remove damage created in an active region. The hydrogen annealing step is schematically illustrated by arrows in FIG. 3C. The hydrogen annealing step has been described in detail with reference to FIG. 1E in the first embodiment. By removing damage from an active region using the hydrogen annealing step, the reliability of a gate oxide layer to be formed later can be improved.

The fact that the breakdown characteristic of a gate oxide layer formed in an active region can be improved by forming an isolation layer according to a preferred trench isolation method, will be described with test examples. Samples C1 and C2 are prepared for a comparative test.

SAMPLE C1

An isolation layer was formed on a silicon substrate according to the trench isolation method of the second embodiment of the present invention. A hydrogen annealing step was performed at a temperature of 800° C. and at a hydrogen pressure of 1 mtorr for five minutes while the isolation layer was being formed. An array of 32,000 gate electrodes was formed on the silicon substrate in a dynamic random access memory (DRAM) cell type pattern. To form the gate electrode, primarily, a gate oxide layer was formed in an active region defined by the isolation layer to a thickness of 75 Å. Then, the gate electrode was formed on the gate oxide layer. The gate electrode was formed in a double layer structure in which a polysilicon layer and a tungsten silicide layer were stacked. The polysilicon layer and the tungsten silicide layer were formed to a thickness of 1000 Å and a thickness of 1500 Å, respectively. Thereafter, an insulating layer was formed on the entire surface of the silicon substrate, and the insulating layer was patterned, thereby forming contact holes exposing the gate electrode and the silicon substrate. Next, contact plugs were formed in the contact holes, and contact pads were formed on the contact plugs.

SAMPLE C2

For a comparative test, the sample C2 was formed under the same conditions as those of the sample C1, with the exception that the hydrogen annealing step was not performed. In other words, without removing damage from an active region, a gate oxide layer and a gate electrode were formed in the active region.

Figure 4:
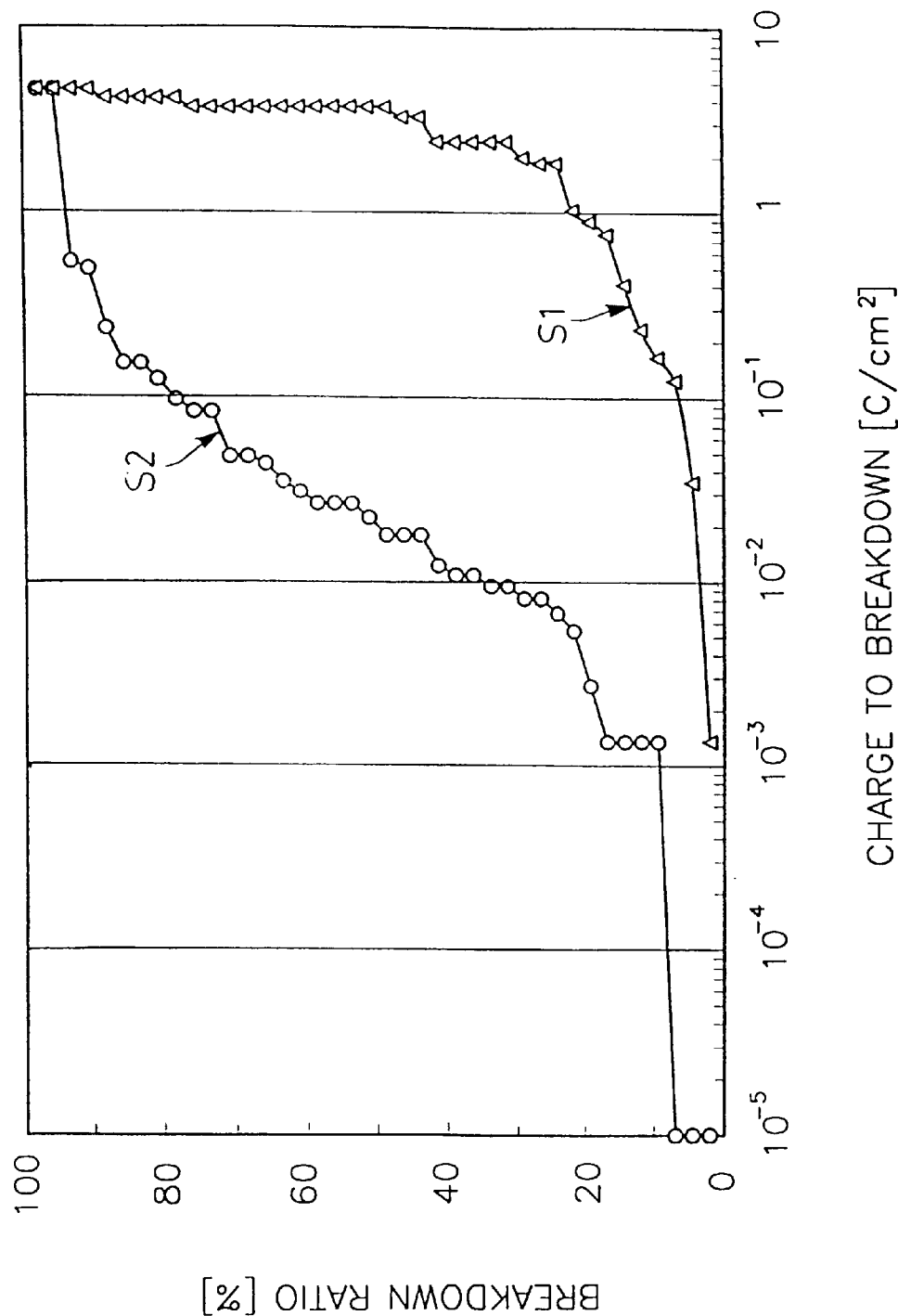
FIG. 4 is a graph for showing the result of a test in which a sample C1 is compared with a sample C2 to explain the effect of a trench isolation method according to the preferred embodiments of the present invention.

After preparing a sample 1 and a sample 2 as described above, 40 cells were selected from each of the sample 1 and the sample 2. For the selected cells, the breakdown characteristics of the gate oxide layers were measured by a JEDEC standard method, and the results are illustrated in FIG. 4. The distribution of breakdown characteristic of the sample 1 is represented by a curve S1, and the distribution of breakdown characteristic of the sample 2 is represented by a curve S2. The horizontal axis indicates the amount of charge which had passed through a unit area of the gate oxide layer until the gate oxide layer was broken down. The vertical axis indicates a percentage of cells in which breakdown occurred when a certain amount of charge passed through a unit area of the gate oxide layer. For example, for the sample 2, about 33% of the selected cells were broken down when a charge of $10^{-2}$ coulombs passed through the unit area of the gate oxide layer.

Referring to FIG. 4, the curve S1 shows a more stable distribution than that shown by the curve S2. About 80% of the gate oxide layer of the selected cells in the sample 1 is broken down at about 5 C/cm². The gate oxide layer of the selected cells of the sample 2 is broken down at about $10^{-3}$–1 C/cm². Accordingly, it can be seen that the reliability of a gate oxide layer can be improved when an isolation layer is formed according to a preferred trench isolation method.

In summary, the preferred embodiments of the present invention provide a trench isolation method including a step of forming a trench in a semiconductor substrate. Next, an isolation layer is formed in the trench. Then, the semiconductor substrate having the isolation layer is annealed in a hydrogen atmosphere.

In forming the trench, a photoresist pattern, patterned to have the width of the isolation layer, is formed on the semiconductor substrate. Next, the semiconductor substrate is etched using the photoresist pattern as an etching mask. Thereafter, the photoresist pattern is removed.

When forming the trench using only the photoresist pattern as an etching mask as described above, the step of forming the isolation layer includes the step of forming a thermal oxide film on the inner wall of the trench. A nitride liner is formed along the surface topology of the thermal oxide film. Next, a gap filling dielectric layer is formed on the entire surface of the semiconductor substrate to fill the trench having the nitride liner. Subsequently, the entire surface of the semiconductor substrate having the gap filling dielectric layer is planarized using the nitride liner as a planarization stop layer. Thereafter, the nitride liner exposed during the planarization and the thermal oxide film on the semiconductor substrate are removed.

Alternatively, a thermal oxide film is formed first on the inner wall of the trench formed in the semiconductor substrate. A gap filling dielectric layer is formed on the entire surface of the semiconductor substrate to fill the trench having the thermal oxide film. The entire surface of the semiconductor substrate having the gap filling dielectric layer is planarized using the semiconductor substrate as a planarization stop layer.

The step of forming the trench may be performed with another method. Primarily, a pad insulating layer is formed on the semiconductor substrate. A photoresist pattern is formed, which is patterned to have the width of the isolation layer, on the pad insulating layer. Next, the pad insulating layer and the semiconductor substrate are etched using the photoresist pattern as an etching mask, thereby forming the trench in the semiconductor substrate. Thereafter, the photoresist pattern is removed.

In yet another method, a pad insulating layer is formed on the semiconductor substrate. A photoresist pattern is formed, patterned to have the width of the isolation layer, on the pad insulating layer. Next, the pad insulating layer is patterned using the photoresist pattern as an etching mask, and then the photoresist pattern is removed. Thereafter, the semiconductor substrate is etched using the patterned pad insulating layer as an etching mask, thereby forming the trench in the semiconductor substrate.

When the pad insulating layer is formed on the semiconductor substrate before forming the photoresist pattern, the step of forming the isolation layer includes the step of forming a thermal oxide film on the inner wall of the trench. A nitride liner is formed on the entire surface of the semiconductor substrate having the thermal oxide film. Thereafter, a gap filling dielectric layer is formed on the entire surface of the semiconductor substrate to fill the trench. Next, the entire surface of the semiconductor substrate having the gap filling dielectric layer is planarized using the nitride liner as a planarization stop layer. Next, the nitride liner used as the planarization stop layer and the pad insulating layer on the semiconductor substrate are removed.

The gap filling dielectric layer planarization step performed during the step of forming the isolation layer is preferably performed by a chemical mechanical polishing method using slurry containing abrasives of the ceria family. It is more preferable to perform the gap filling dielectric layer planarization step by a chemical mechanical polishing method using slurry containing an anion surfactant in addition to abrasives of the ceria family.

When performing the gap filling dielectric layer planarization step using a chemical mechanical polishing method as described above, the pH of the slurry is preferably controlled to be about 7.

The step of annealing the semiconductor substrate having the isolation layer in a hydrogen atmosphere may be performed under the following conditions. A hydrogen gas may be used to create a hydrogen atmosphere for the hydrogen annealing step. The hydrogen annealing step may be performed at a temperature of 500–950° C. When performing the hydrogen annealing step, the pressure of hydrogen gas in a chamber is controlled to be $10^{-4}$–$10^3$ torr.

Thus, the preferred trench isolation methods improve the reliability of a gate oxide layer formed in an active region. In addition, fabrication according to the preferred methods is simpler as compared with a conventional trench isolation method, and the preferred methods are, therefore, economical. The preferred methods also alleviate occurrence of voids in a trench when the trench is filled with a gap filling dielectric layer.

While preferred embodiments of the present invention have been particularly shown and described, it will be understood by those skilled in the art that various changes in form and details may be made therein without departing from the spirit and scope of the invention defined by the appended claims.

What is claimed is:

1. A trench isolation method comprising:

forming a trench in a semiconductor substrate;

forming an isolation layer in the trench by forming a gap filling dielectric layer for filling the trench on a surface of the semiconductor substrate; and planarizing a top surface of the semiconductor substrate having the gap filling dielectric layer using the semiconductor substrate as a planarization stop layer so that the top surface of the semiconductor substrate is exposed, wherein the step of planarizing is performed by chemical mechanical polishing method using a slurry containing abrasives of the ceria family; and annealing the semiconductor substrate, having the top surface exposed and having the isolation layer, in a hydrogen atmosphere.

2. The trench isolation method of claim 1 wherein forming the trench comprises:

forming a photoresist pattern on the semiconductor substrate, the photoresist pattern being patterned to have a width of the isolation layer;

etching the semiconductor substrate using the photoresist pattern as a mask; and removing the photoresist pattern.

3. The trench isolation method of claim 1 wherein the hydrogen annealing step uses a hydrogen gas to create a hydrogen atmosphere.

4. The trench isolation method of claim 1 wherein the hydrogen annealing step is performed at a temperature of 500–950° C.

5. The trench isolation method of claim 1 wherein in the hydrogen annealing step is performed under a hydrogen gas atmosphere having a pressure of $10^{-4}$–$10^3$ torr in a chamber.

6. The trench isolation method of claim 1, wherein the slurry containing anion surfactant.

* * * * *